United States Patent
Tan et al.

(10) Patent No.: US 10,551,673 B2
(45) Date of Patent: Feb. 4, 2020

(54) LIGHT SOURCE ASSEMBLY, BACK LIGHT MOUDLE AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Sen Tan, Beijing (CN); Sijun Lei, Beijing (CN); Liang Gao, Beijing (CN); Yansheng Sun, Beijing (CN); Wencheng Luo, Beijing (CN); Wei Fu, Beijing (CN); Qihai Du, Beijing (CN); Song Liu, Beijing (CN); Yuxu Geng, Beijing (CN); Hebing Ma, Beijing (CN); Na Shao, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/334,193

(22) PCT Filed: May 15, 2018

(86) PCT No.: PCT/CN2018/086852
§ 371 (c)(1),
(2) Date: Mar. 18, 2019

(87) PCT Pub. No.: WO2018/228115
PCT Pub. Date: Dec. 20, 2018

(65) Prior Publication Data
US 2019/0204686 A1 Jul. 4, 2019

(30) Foreign Application Priority Data
Jun. 16, 2017 (CN) .................... 2017 2 0704622 U

(51) Int. Cl.
*H01S 5/00* (2006.01)
*G02F 1/1335* (2006.01)
*H01S 5/042* (2006.01)

(52) U.S. Cl.
CPC ........ *G02F 1/133621* (2013.01); *H01S 5/005* (2013.01); *H01S 5/0425* (2013.01)

(58) Field of Classification Search
CPC .. G02F 1/133621; G02F 1/1336; H01S 5/005; H01S 5/0425
See application file for complete search history.

(56) References Cited

U.S. PATENT DOCUMENTS 5,355,385 A * 10/1994 Amano .................. G11B 7/123
372/49.01
5,485,479 A * 1/1996 Kitamura ............... G11B 7/123
257/787

(Continued)

FOREIGN PATENT DOCUMENTS

CN 101673005 A 3/2010
CN 102767739 A 11/2012

(Continued)

OTHER PUBLICATIONS

The International Search Report, for International Application No. PCT/CN2018/086852 dated Aug. 6, 2018, 9 pages.

(Continued)

*Primary Examiner* — Donald L Raleigh
(74) *Attorney, Agent, or Firm* — Westman, Champlin & Koehler, P.A.

(57) ABSTRACT

The present disclosure provides a light source assembly, a backlight module, and a display device. The light source assembly includes: at least one semiconductor laser, at least one beam expander, and a package; the at least one semiconductor laser and the at least one beam expander are in one-to-one correspondence and are all encapsulated in the (Continued)

package; each of the at least one beam expander is disposed on a side of a light emitting surface of a corresponding one of the at least one semiconductor laser; light emitted by each of the at least one semiconductor laser is expanded by a corresponding one of the at least one beam expander and then emitted from the package.

10 Claims, 2 Drawing Sheets

(56) References Cited

U.S. PATENT DOCUMENTS

| | | | |
|---|---|---|---|
| 8,259,257 B2 | 9/2012 | Akiba et al. | |
| 9,347,644 B2 | 5/2016 | Araki et al. | |
| 2001/0053017 A1* | 12/2001 | Oyama | G02B 1/02 359/350 |
| 2010/0066943 A1 | 3/2010 | Akiba et al. | |
| 2014/0286019 A1 | 9/2014 | Araki et al. | |
| 2016/0011361 A1 | 1/2016 | Zhang et al. | |
| 2019/0131766 A1* | 5/2019 | Enzmann | H01S 5/02296 |

FOREIGN PATENT DOCUMENTS

| | | |
|---|---|---|
| CN | 103477252 A | 12/2013 |
| CN | 103791288 A | 5/2014 |
| CN | 104110614 A | 10/2014 |
| CN | 204962474 U | 1/2016 |
| CN | 206773352 U | 12/2017 |
| KR | 20090054841 A | 6/2009 |

OTHER PUBLICATIONS

The Written Opinion, including English translation of Box V, for International Application No. PCT/CN2018/086852 dated Aug. 6, 2018, 7 pages.

* cited by examiner

LIGHT SOURCE ASSEMBLY, BACK LIGHT MOUDLE AND DISPLAY DEVICE

CROSS-REFERENCE TO RELATED APPLICATION

This application is a Section 371 National Stage Application of International Application No. PCT/CN2018/086852, filed on May 15, 2018. This application claims the benefit of Chinese Patent Application No. 201720704622.1 filed on Jun. 16, 2017 in the State Intellectual Property Office of China, the disclosures of which are incorporated herein by reference.

TECHNICAL FIELD

The present disclosure relates to the field of display technology, and in particular, to a light source assembly, a back light module and a display device.

BACKGROUND

With the development of technology, people are increasingly demanding display products. Liquid crystal display devices are widely used in display devices due to their low power consumption and light weight.

At present, most of backlight modules of liquid crystal display devices use light-emitting diodes (LEDs) as backlights. However, as backlights, LEDs emit a wide and scattered spectrum of light, and have low brightness and high power consumption.

SUMMARY

The present disclosure provides a light source assembly, a backlight module, and a display device.

On an aspect, an embodiment of the present disclosure provides a light source assembly comprising: at least one semiconductor laser, at least one beam expander, and a package; wherein the at least one semiconductor laser and the at least one beam expander are in one-to-one correspondence and are all encapsulated in the package; each of the at least one beam expander is disposed on a side of a light emitting surface of a corresponding one of the at least one semiconductor laser; light emitted by each of the at least one semiconductor laser is expanded by a corresponding one of the at least one beam expander and then emitted from the package.

In some embodiments, three semiconductor lasers are encapsulated in the package and are respectively a red light semiconductor laser, a green light semiconductor laser, and a blue light semiconductor laser; light emitted by the three semiconductor lasers is mixed into white light in the package after being respectively expanded by corresponding beam expanders.

In some embodiments, the at least one beam expander comprises a concave lens.

In some embodiments, light generated by the at least one semiconductor laser is oscillated and amplified in a resonant cavity of the least one semiconductor laser and propagates along a plane of an active region of the least one semiconductor laser, and the light emitted by the at least one semiconductor laser is parallel to an optical axis of the concave lens.

In some embodiments the package is made of transparent silica gel.

In some embodiments the package has a length of 3.8 mm, a width of 1.0 mm, and a height of 0.6 mm, respectively.

In some embodiments, only one semiconductor laser is encapsulated in the package and is a white light semiconductor laser.

In some embodiments, the at least one semiconductor laser comprises: a first electrode and a second electrode opposite to each other; a P region and an N region both between the first electrode and the second electrode; and an active region between the P region and the N region.

On another aspect, an embodiment of the present disclosure provides a backlight module comprising the light source assembly of the above embodiments.

On yet another aspect, an embodiment of the present disclosure provides display device comprising the backlight module of embodiments.

DETAILED DESCRIPTION OF THE EMBODIMENTS

The technical solutions in the embodiments of the present disclosure are clearly and completely described below in conjunction with the accompanying drawings in the embodiments of the present disclosure. It is obvious that the described embodiments are only a part of the embodiments of the present disclosure, and not all of the embodiments. All other embodiments obtained by those skilled in the art based on the embodiments of the present disclosure without creative efforts are within the scope of the present disclosure.

An embodiment of the present disclosure provides a light source assembly, the light source assembly includes at least one semiconductor laser, at least one beam expander, and a package.

The at least one beam expander is in one-to-one correspondence with the at least one semiconductor laser and is disposed on one side of a light emitting surface of a corresponding semiconductor laser. In this case, light emitted by of the at least one semiconductor laser is expanded by a corresponding beam expander and then emitted from the package.

Specifically, the package may accommodate a white light semiconductor laser, or may accommodate a plurality of semiconductor lasers, such as a red light semiconductor laser, a green light semiconductor laser, and a blue light semiconductor laser, one beam expander is disposed on a side of a light emitting surface of each of the plurality of semiconductor lasers. After being expanded, light of three colors is mixed to obtain white light which is emitted from the package.

As can be seen from the above, the embodiment of the present disclosure include the following advantages:

In the light source assembly, the semiconductor laser is used as the light source, so that the monochromaticity of the light source is improved. The light emitted by the semiconductor laser is expanded by the beam expander and then emitted, thereby effectively improving the light intensity and brightness of the light source assembly.

Figure 1:
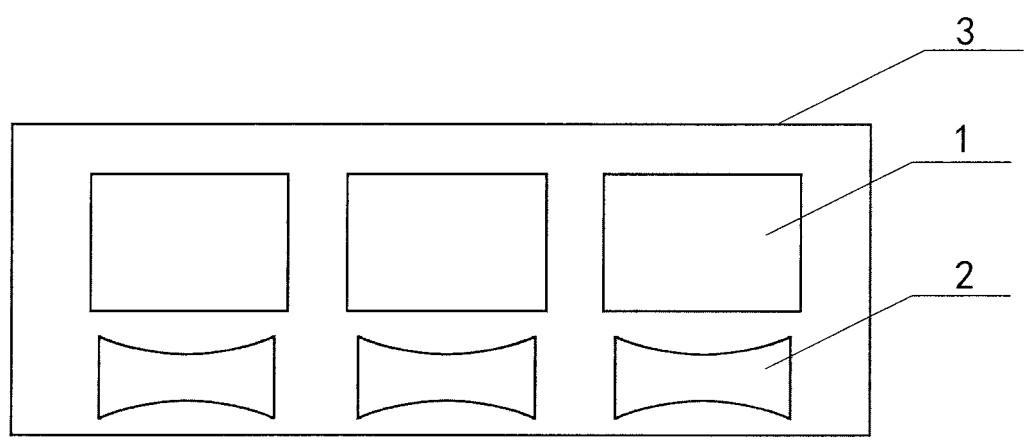
FIG. 1 is a schematic structural view of a light source assembly according to an embodiment of the present disclosure.

FIG. 1 is a schematic structural view of a light source assembly according to an embodiment of the present disclosure. As shown in FIG. 1, The light source assembly includes at least one semiconductor laser 1, at least one beam expander, and a package 3.

The beam expander may specifically be a concave lens 2.

Three semiconductor lasers 1 are encapsulated in the package 3, and are respectively a red light semiconductor laser, a green light semiconductor laser, and a blue light semiconductor laser. Correspondingly, one concave lens 2 is provided on one side of an light-emitting surface of each of the three semiconductor lasers 1. The light emitted by the red semiconductor laser, the green semiconductor laser, and the blue semiconductor laser is expanded by the corresponding concave lens 2, and then mixed in the package 3 to obtain white light.

In the related art, the light source used in the backlight module is generally a light emitting diode, which contains a PN junction, and can generate photon to emit light when energized or powered. A white light LED are usually produced by using a blue-emitting chip and a yellow phosphor, however, in this case, the white light spectrum is wide and scattered, and the color gamut is low. If it is replaced with some special phosphors (such as KSF powder), the color gamut can be improved, however, the increase is limited and the brightness of the light source is greatly reduced.

In this embodiment, the semiconductor lasers 1 are used as light sources. The semiconductor lasers 1 have the advantages of small volume, low driving power and current, high efficiency, long working life, and easy integration with various optoelectronic devices, and the semiconductor lasers 1 may emit light with good monochromaticity. The light emitted by the semiconductor lasers 1 is expanded by the concave lenses 2, respectively, and then mixed to obtain white light, which can effectively improve the light intensity and brightness of the light source assembly, and improve the color gamut of the light source.

Figure 2:
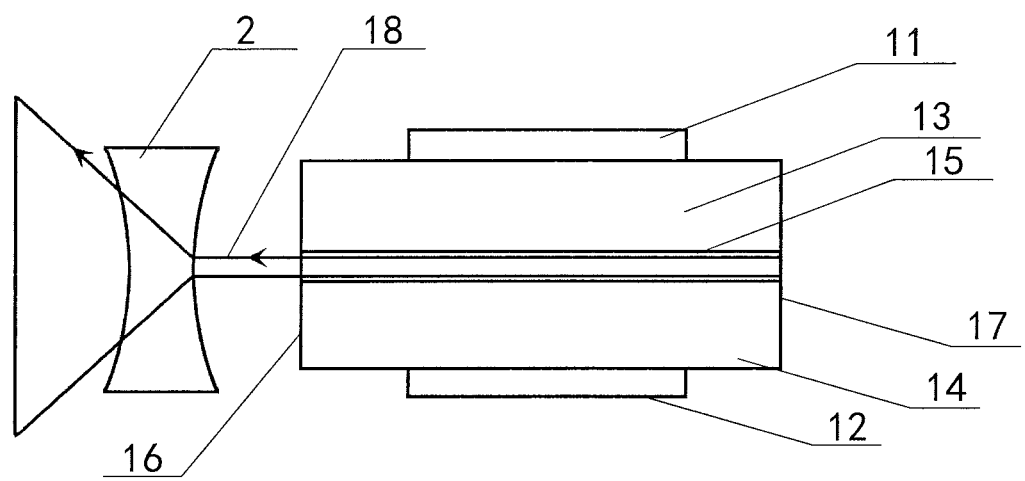
FIG. 2 is a schematic structural view of a single semiconductor laser and a corresponding concave lens according to an embodiment of the present disclosure.

Referring to FIG. 2, a schematic structural view of a single semiconductor laser and a corresponding concave lens is shown.

The semiconductor laser 1 includes a first electrode such as an upper electrode 11, a second electrode such as a lower electrode 12, a P region 13 and an N region 14, and a region between the P region 13 and the N region 14 is an active region 15. The semiconductor laser further includes a resonant cavity formed between a first resonant cavity surface 16 and a second resonant cavity surface 17. The concave lens 2 is disposed on a side of a resonant cavity surface from which the semiconductor laser 1 emits light. In the present embodiment, the concave lens is disposed on a side of the first resonant cavity surface 16.

A voltage is applied between the upper electrode 11 and the lower electrode 12 of the semiconductor laser 1, and when the energization excitation causes the gain of the active region 15 to be greater than the consumption, a light beam 18 is oscillated and amplified in the resonant cavity formed between the first resonant cavity surface 16 and the second resonant cavity surface 17 and propagates along a plane of the active region 15 to obtain light having good monochromaticity. Further, in order to make the light beam 18 have a good beam expanding effect, the light beam 18 emitted from the semiconductor laser 1 is parallel to an optical axis of the concave lens 2.

In the embodiment, the material of the package 3 may be transparent silica gel. The transparent silica gel has the characteristics of heat resistance, cold resistance, dielectric property and weather resistance, and is suitable for making the package of the light source assembly. Of course, other transparent encapsulating materials may also be used, and the present disclosure is not limited thereto.

In order to facilitate the application of the light source assembly in the backlight module and the display device, the package 3 is set to have a small size. The length, width, and height of the package 3 are 3.8 mm, 1.0 mm, and 0.6 mm, respectively.

As can be seen from the above, the embodiments of the present disclosure include the following advantages:

The red semiconductor laser, the green semiconductor laser and the blue semiconductor laser are encapsulated in the same package, and light emitted by each of the three semiconductor lasers is expanded by a concave lens disposed on the light emitting surface thereof, so that the three kinds of light are mixed in the package to obtain white light. The light emitted by the semiconductor lasers has good monochromaticity, and the mixed white light has a high color gamut and a large brightness. In addition, the light source assembly has the advantages of small volume, high efficiency, long working life, and low power consumption.

The embodiment of the present disclosure further provides a backlight module including the light source assembly of the above embodiment.

The embodiment of the present disclosure further provides a display device including the above backlight module.

By applying the light source assembly to the display device, the color gamut and the brightness of the display device can be greatly improved without changing the color filter glass.

The display device provided by the embodiment of the present disclosure may be a product having a display function, such as a liquid crystal display, a liquid crystal television, a digital camera, a mobile phone, a tablet computer, etc., and the disclosure is not limited thereto.

The various embodiments in the present specification are described in a progressive manner, and each embodiment focuses on differences from other embodiments, and the same or similar parts between the various embodiments can be referred to each other. For the system embodiment, since it is basically similar to the method embodiment, the description is relatively simple, and the relevant parts can be referred to the description of the method embodiment.

Although some embodiments of the present disclosure has been described, however, those skilled in the art can make additional changes and modifications to these embodiments once they become aware of the basic inventive concept. Therefore, the appended claims are intended to be interpreted as including the some embodiments and the modifications.

Finally, it should also be noted that in this disclosure, relational terms such as first and second are used merely to distinguish one entity or operation from another entity or operation, and do not necessarily require or imply that there is any such actual relationship or order between these entities or operations. Furthermore, the terms "comprises" or "comprising" or "comprising" or any other variations are intended to encompass a non-exclusive inclusion, such that a process, method, article, or terminal device that includes a plurality of elements includes not only those elements but also other elements not explicitly listed, or include elements inherent to such a process, method, article, or terminal device. An element defined by the phrase "comprising a . . . " does not exclude the presence of additional identical elements in the process, method, article, or terminal device that comprises the element, without further limitation.

The above is only the specific embodiment of the present disclosure, but the scope of the present disclosure is not limited thereto, and any person skilled in the art can easily think of changes or substitutions within the technical scope of the disclosure. It should be covered within the scope of protection of the present disclosure. Therefore, the scope of protection of the present disclosure should be determined by the scope of the claims.

What is claimed is:

1. A light source assembly comprising:
    at least one semiconductor laser, at least one beam expander, and a package;
    wherein the at least one semiconductor laser and the at least one beam expander are in one-to-one correspondence and are all encapsulated in the package;
    each of the at least one beam expander is disposed on a side of a light emitting surface of a corresponding one of the at least one semiconductor laser;
    light emitted by each of the at least one semiconductor laser is expanded by a corresponding one of the at least one beam expander and then emitted from the package.

2. The light source assembly of claim 1, wherein three semiconductor lasers are encapsulated in the package and are respectively a red light semiconductor laser, a green light semiconductor laser, and a blue light semiconductor laser;
    light emitted by the three semiconductor lasers is mixed into white light in the package after being respectively expanded by corresponding beam expanders.

3. The light source assembly of claim 1, wherein the at least one beam expander comprises a concave lens.

4. The light source assembly of claim 3, wherein light generated by the at least one semiconductor laser is oscillated and amplified in a resonant cavity of the least one semiconductor laser and propagates along a plane of an active region of the least one semiconductor laser, and the light emitted by the semiconductor laser is parallel to an optical axis of the concave lens.

5. The light source assembly of claim 1, wherein the package is made of transparent silica gel.

6. The light source assembly of claim 1, wherein the package has a length of 3.8 mm, a width of 1.0 mm, and a height of 0.6 mm, respectively.

7. A backlight module comprising the light source assembly of claim 1.

8. A display device comprising the backlight module of claim 7.

9. The light source assembly of claim 1, wherein only one semiconductor laser is encapsulated in the package and is a white light semiconductor laser.

10. The light source assembly of claim 1, wherein the at least one semiconductor laser comprises:
    a first electrode and a second electrode opposite to each other;
    a P region and an N region both between the first electrode and the second electrode; and
    an active region between the P region and the N region.

* * * * *

UNITED STATES PATENT AND TRADEMARK OFFICE
CERTIFICATE OF CORRECTION

PATENT NO. : 10,551,673 B2
APPLICATION NO. : 16/334193
DATED : February 4, 2020
INVENTOR(S) : Sen Tan et al.

It is certified that error appears in the above-identified patent and that said Letters Patent is hereby corrected as shown below:

On the Title Page

Item (54) and in the Specification Line 2, Column 1:
Change "MOUDLE" to --MODULE--.

Signed and Sealed this
Thirty-first Day of March, 2020

Andrei Iancu
*Director of the United States Patent and Trademark Office*